United States Patent
Chiu

(10) Patent No.: US 11,960,684 B2
(45) Date of Patent: Apr. 16, 2024

(54) LIGHT-EMITTING TOUCH PANEL

(71) Applicant: Chicony Power Technology Co., Ltd., New Taipei (TW)

(72) Inventor: Chen-Hao Chiu, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 18/308,190

(22) Filed: Apr. 27, 2023

(65) Prior Publication Data

US 2024/0028164 A1    Jan. 25, 2024

Related U.S. Application Data

(60) Provisional application No. 63/390,749, filed on Jul. 20, 2022.

(30) Foreign Application Priority Data

Jan. 19, 2023   (TW) .................................. 112102753

(51) Int. Cl.
  *G06F 3/042*   (2006.01)
  *F21V 8/00*   (2006.01)

(52) U.S. Cl.
  CPC ......... *G06F 3/0421* (2013.01); *G02B 6/0051* (2013.01)

(58) Field of Classification Search
  CPC .................................................. G06F 3/0421
  See application file for complete search history.

(56) References Cited

U.S. PATENT DOCUMENTS

| | | | |
|---|---|---|---|
| 8,537,140 B2* | 9/2013 | Tsai ..................... | G06F 3/0416 345/173 |
| 11,334,172 B2* | 5/2022 | Chan ..................... | H01H 13/83 |
| 11,675,119 B1* | 6/2023 | Ho ..................... | G02B 6/0068 362/606 |
| 2009/0021492 A1* | 1/2009 | Wu ..................... | G06F 3/045 345/175 |

(Continued)

FOREIGN PATENT DOCUMENTS

| CN | 104516589 | 4/2015 |
|---|---|---|
| CN | 108520890 | 9/2018 |

(Continued)

*Primary Examiner* — Chun-Nan Lin
(74) *Attorney, Agent, or Firm* — Andrew M. Calderon; Calderon Safran & Cole, PC

(57) ABSTRACT

A light-emitting touch panel includes a circuit board, a plurality of light-emitting elements, a shading plate and a cover plate. The light emitting element has a first height in a first direction. The shading plate has a plurality of spacing regions corresponding to the light emitting elements, respectively. A first width is provided between two partition walls of each spacing region in a second direction. Each partition wall has a second height in the first direction, and the second height is greater than the first height. The cover plate has a light-transmitting region, the light emitted by the light-emitting elements passes through the light-transmitting region, and a bright region is formed on the top surface of the cover plate away from the shading plate, wherein a second width of the bright region in the second direction is related to the second height and the first width.

14 Claims, 12 Drawing Sheets

(56) References Cited

U.S. PATENT DOCUMENTS

| | | | |
|---|---|---|---|
| 2011/0267285 A1* | 11/2011 | Cheng | G06F 3/0421 |
| | | | 345/173 |
| 2013/0147757 A1* | 6/2013 | Chen | G06F 3/0238 |
| | | | 345/173 |
| 2014/0340353 A1* | 11/2014 | Chen | H03K 17/962 |
| | | | 345/174 |
| 2018/0024736 A1* | 1/2018 | Lin | G06F 1/1662 |
| | | | 345/173 |
| 2019/0324580 A1 | 10/2019 | Tanaka | |

FOREIGN PATENT DOCUMENTS

| | | |
|---|---|---|
| CN | 110390904 | 10/2019 |
| CN | 111338513 | 6/2020 |
| CN | 112103308 | 12/2020 |
| CN | 112162428 | 1/2021 |
| CN | 114509895 | 5/2022 |
| TW | 201731129 A | 9/2017 |
| TW | 201819818 A | 6/2018 |
| TW | 201931625 | 8/2019 |
| TW | 202024693 A | 7/2020 |
| TW | M597885 | 7/2020 |
| TW | I719794 | 8/2020 |
| TW | I684123 | 11/2020 |
| TW | 202125848 A | 7/2021 |
| TW | 202201778 | 1/2022 |
| WO | 2018152383 | 8/2018 |

\* cited by examiner

LIGHT-EMITTING TOUCH PANEL

CROSS-REFERENCES TO RELATED APPLICATIONS

This application claims the benefit of U.S. provisional application Ser. No. 63/390,749, filed on Jul. 20, 2022 and claims the priority of Patent Application No. 112102753 filed in Taiwan, R.O.C. on Jan. 19, 2023. The entirety of the above-mentioned patent applications are hereby incorporated by references herein and made a part of the specification.

BACKGROUND

Technical Field

The disclosure relates to the field of electronics, in particular to a light-emitting touch panel.

Related Art

As the electronic apparatus such as notebook computers are becoming thinner and lighter, some mechanical input functions are replaced by touch panels, such as numeric keys. The traditional light-emitting touch panel is typically a single-layer or double-layer light-emitting structure whose pattern is arranged on the light guide plate. After the light-emitting elements on the side emit light, the corresponding pattern appears on the light-emitting touch panel.

However, as the number of functions to be applied grows, n layers of light guide plates need to be designed to display n types of graphics. This increases the overall thickness and is not conducive to the element configuration of the overall electronic apparatus or equipment.

SUMMARY

In order to solve the above problems, in some embodiments, the disclosure provides a light-emitting touch panel. The light-emitting touch panel includes a circuit board, a plurality of light-emitting elements, a shading plate and a cover plate. The light-emitting elements are arranged on the circuit board in two dimensions. Each of the light-emitting elements has a first height in a first direction. The shading plate is disposed above the circuit board. The shading plate has a plurality of spacing regions, and the spacing regions are corresponding to the light-emitting elements respectively. The light-emitting elements are respectively received in the spacing regions, and a first width is provided between two partition walls of each spacing region in a second direction. Each partition wall has a second height in the first direction, and the second height is greater than the first height. The second direction is orthogonal to the first direction. The cover plate is disposed above the shading plate. The cover plate has a light-transmitting region. Light emitted by the light-emitting elements passes through the light-transmitting region, and a bright region is formed on a top surface of the cover plate away from the shading plate. A second width of the bright region in the second direction is related to the second height and the first width.

In some embodiments, each of the light-emitting elements has a light-emitting angle. A projection height of the light-emitting element is defined as Equation (I). A height difference between the second height and the first height is greater than the projection height, and the second width of the bright region in the second direction is equal to the first width. Equation (I) is $$Hc = \frac{W1}{2}\tan(90 - \frac{\theta}{2}),$$

where Hc is the projection height, W1 is the first width, and θ is the light-emitting angle.

In some embodiments, each of the light-emitting elements has a light-emitting angle. A projection height of the light-emitting element is defined as Equation (I). The cover plate has a thickness in the first direction. A height difference between the second height and the first height is greater than a difference between the projection height and the thickness, and the height difference between the second height and the first height is less than the projection height. The second width of the bright region in the second direction is greater than the first width. Equation (I) is $$Hc = \frac{W1}{2}\tan(90 - \frac{\theta}{2}),$$

where Hc is the projection height, W1 is the first width, and θ is the light-emitting angle.

In some embodiments, each of the light-emitting elements has a light-emitting angle. A projection height of the light-emitting element is defined as Equation (I). The cover plate has a thickness in the first direction. A height difference between the second height and the first height is less than a difference between the projection height and the thickness, and the second width of the bright region in the second direction is less than the first width. Equation (I) is $$Hc = \frac{W1}{2}\tan(90 - \frac{\theta}{2}),$$

where Hc is the projection height, W1 is the first width, and θ is the light-emitting angle.

In some embodiments, each of the partition walls is provided with a reflective element.

In some embodiments, the cover plate includes a light-transmitting cover plate and a semi-light-transmitting layer. The semi-light-transmitting layer is disposed on the light-transmitting cover plate.

In more detail, in some embodiments, the cover plate is further provided with a plurality of shading elements, a plurality of light exit regions are defined between the shading elements, and the light exit regions are respectively corresponding to the spacing regions. Further, in some embodiments, the light-emitting touch panel further includes a diffusion sheet. The diffusion sheet is on the shading plate and between the shading plate and the shading elements.

In more detail, in some embodiments, the light-emitting touch panel further includes a diffusion sheet. The diffusion sheet is on the shading plate and between the shading plate and the semi-light-transmitting layer.

In some embodiments, the cover plate is a semi-light-transmitting polyester film sheet.

In more detail, in some embodiments, the cover plate is further provided with a plurality of shading elements, a plurality of light exit regions are defined between the shading elements, and the light exit regions are respectively corresponding to the spacing regions. Further, in some embodiments, the light-emitting touch panel further includes a diffusion sheet. The diffusion sheet is on the shading plate and between the shading plate and the shading elements.

In more detail, the light-emitting touch panel further includes a diffusion sheet. The diffusion sheet is on the shading plate and between the shading plate and the cover plate.

In some embodiments, the light-emitting touch panel further includes a sensing electrode layer and a control unit. The sensing electrode layer and the light-emitting element are jointly disposed on a first surface of the circuit board, and the sensing electrode layers define a plurality of touch-sensitive regions. A plurality of light-emitting element regions are defined on the circuit board and configured to provide the light-emitting elements, and the light-emitting element regions are adjacent to but spaced apart from one of the touch-sensitive regions. The control unit is disposed on a second surface of the circuit board opposite to the first surface. The control unit is electrically connected to the sensing electrode layer and the light-emitting elements and configured to control a light-emitting state and a light-emitting sequence of the light-emitting elements according to sensing results by the sensing electrode layer.

As described in the foregoing embodiments, the light-emitting elements and the shading plate are directly assembled on the circuit board, and the light-emitting touch panel emits light in a direct-light-type, so that the visual pattern is directly displayed through the light-emitting elements. Therefore, it is no need to use a light guide plate. This can greatly reduce the thickness of the light-emitting touch panel. Since the light-emitting elements can be independently controlled, different light-emitting states and light-emitting sequences can be produced according to control signals, so that a wider range of input functions can be provided.

DETAILED DESCRIPTION

Figure 1:
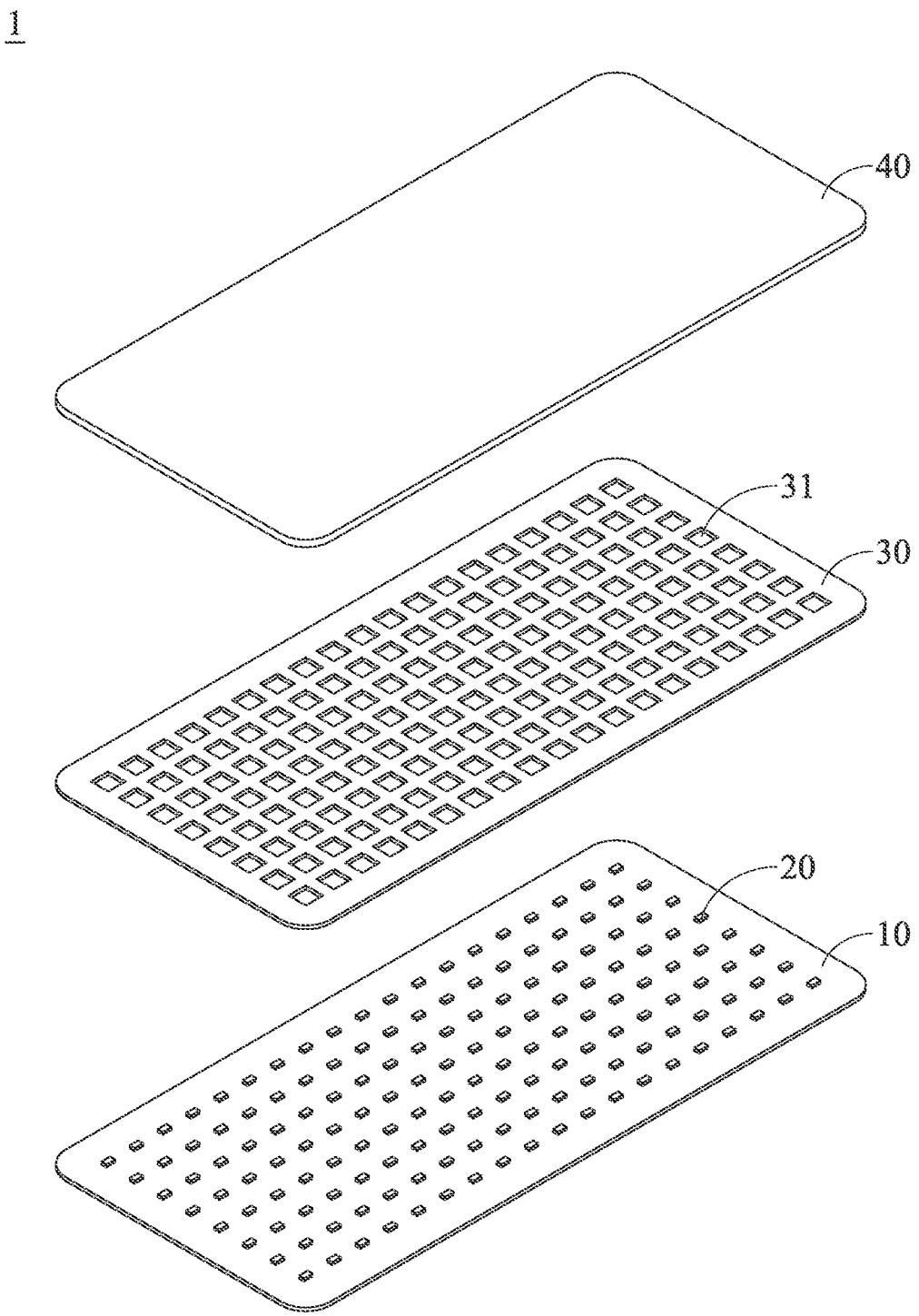
FIG. 1 is an exploded view of a light-emitting touch panel according to an embodiment.

It should be understood that when an element is defined as being "disposed" on another element, it may mean that the element is directly located on another element, or there may be an intermediate element through which the element is connected to another element. On the contrary, when an element is defined as being "directly disposed on another element" or "directly disposed to another element", it can be understood that there is no intermediate element at this time.

In addition, the terms "first", "second" and "third" are only used to distinguish one element, component, region, layer or part from another element, component, region, layer or part, and do not indicate their necessary order. Besides, relative terms such as "lower" and "upper" may be used herein to describe the relationship of one element to another element, and it should be understood that relative terms are intended to include different orientations of the apparatus other than those shown in the drawings. For example, if the apparatus in one drawing is turned over, the element described as being on the "lower" side of the other element will be oriented on the "upper" side of the other element. This only indicates the relative orientation relationship, not the absolute orientation relationship.

FIG. 1 is an exploded view of a light-emitting touch panel according to an embodiment. As shown in FIG. 1, the light-emitting touch panel 1 includes a circuit board 10, a plurality of light-emitting elements 20, a shading plate 30 and a cover plate 40. The light-emitting elements 20 are arranged on the circuit board 10 in two dimensions. The shading plate 30 is disposed above the circuit board 10. The shading plate 30 has a plurality of spacing regions 31, and the spacing regions 31 are corresponding to the light-emitting elements 20 respectively. The light-emitting elements 20 are respectively received in the spacing regions 31. The cover plate 40 is disposed above the shading plate 30. Here, the light-emitting element 20 may be a mini LED or a Micro LED.

Figure 2:
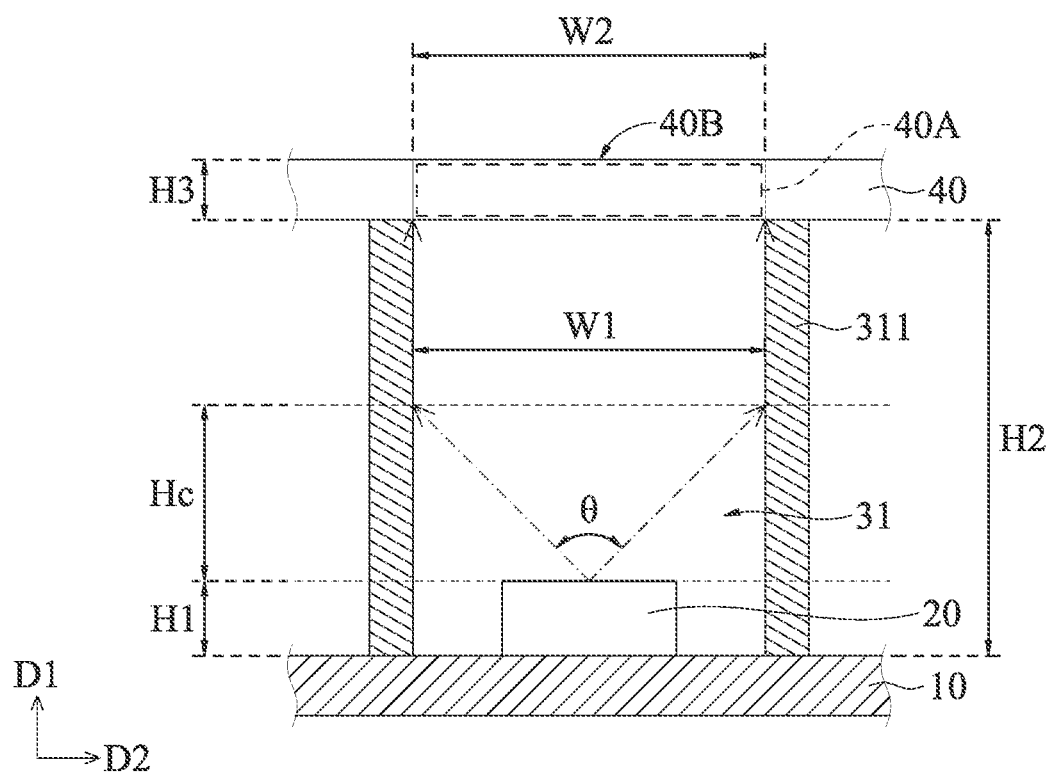
FIG. 2 to FIG. 4 are schematic diagrams showing partial light-emitting states of light-emitting touch panels according to Embodiment I to Embodiment III.
Figure 3:
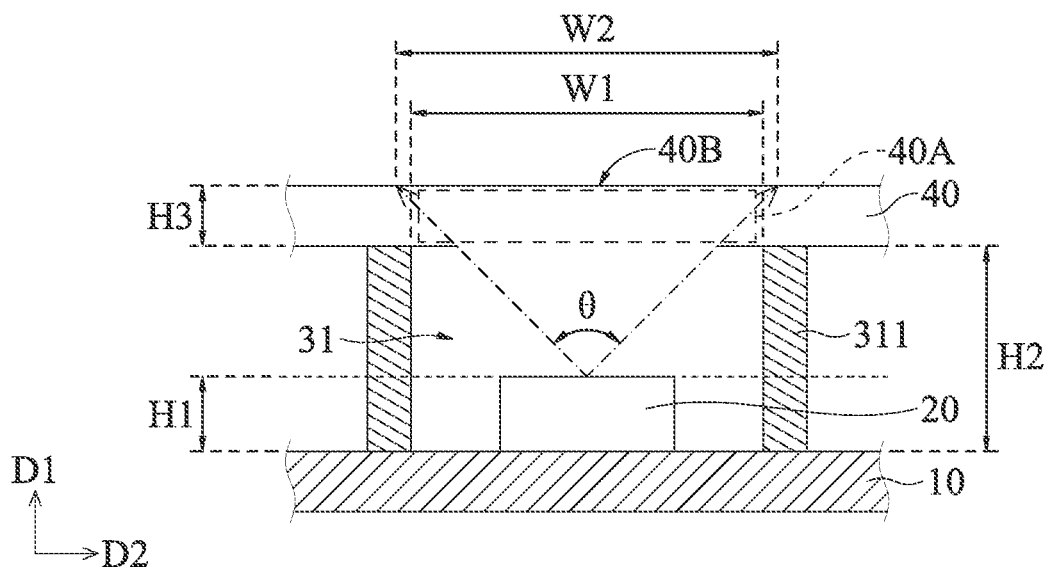
Figure 4:
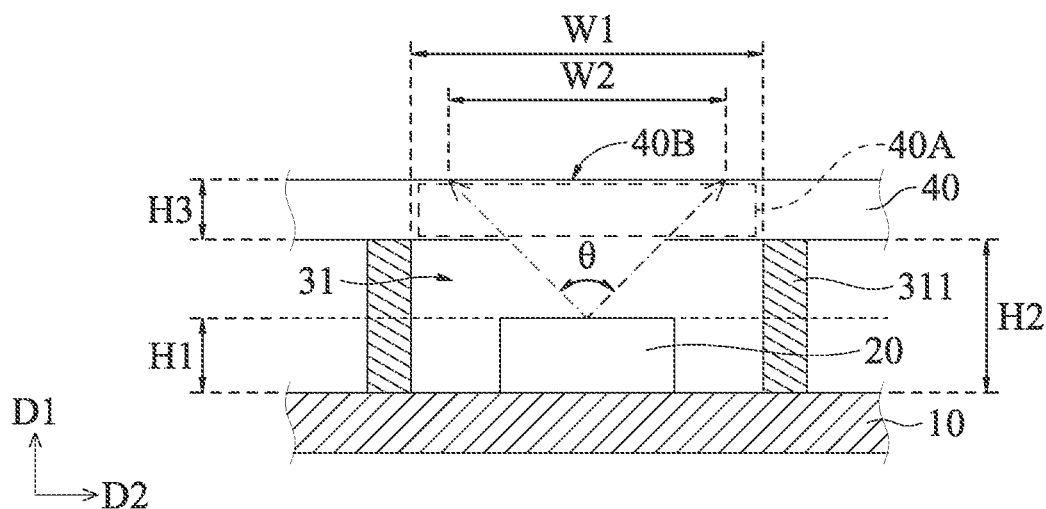

FIG. 2 to FIG. 4 are schematic diagrams showing partial light-emitting states of light-emitting touch panels according to Embodiment I to Embodiment III. As shown in FIG. 2 to FIG. 4, here, in order to show the light-emitting state, for the convenience of description, only one single light-emitting element 20 and one spacing region 31 are shown. In addition, the main optical path of the light-emitting element 20 is represented by dotted lines, which is only illustrated here as an example and not intended to be limiting. The light-emitting element 20 has a first height H1 in a first direction D1. A first width W1 is provided between two partition walls 311 of each spacing region 31 in a second direction D2. Each partition wall 311 has a second height H2 in the first direction D1, and the second height H2 is greater than the first height H1. The second direction D2 is orthogonal to the first direction D1. The cover plate 40 has a light-transmitting region 40A. Light emitted by the light-emitting elements 20 passes through the light-transmitting region 40A, and a bright region 40B is formed on a top surface of the cover plate 40 away from the shading plate 30. A second width W2 of the bright region 40B in the second direction D2 is related to the second height H2 and the first width W1.

In more detail, as shown in FIG. 2, each light-emitting element 20 is defined to have a light-emitting angle θ, and a projection height Hc of the light-emitting element 20 is defined as Equation (I). In Embodiment I, a height difference between the second height H2 and the first height H1 is greater than the projection height Hc, i.e., when (H2−H1) >Hc, the second width W2 of the bright region 40B in the second direction D2 is equal to the first width W1. Equation (I) is $$Hc = \frac{W1}{2}\tan(90 - \frac{\theta}{2}),$$

where Hc is the projection height, W1 is the first width, and θ is the light-emitting angle.

As shown in FIG. 3, in Embodiment II, the cover plate 40 has a thickness H3 in the first direction D1. A height difference between the second height H2 and the first height H1 is greater than a difference between the projection height Hc and the thickness H3, and the height difference between the second height H2 and the first height H1 is less than the projection height Hc, i.e., when (Hc-H3)<(H2-H1)<Hc, the second width W2 of the bright region 40B in the second direction D2 is greater than the first width W1.

As shown in FIG. 4, in Embodiment III, a height difference between the second height H2 and the first height H1 is less than a difference between the projection height Hc and the thickness H3, i.e., when (H2-H1)<(Hc-H3), the second width W2 of the bright region 40B in the second direction D2 is less than the first width W1.

Figure 5:
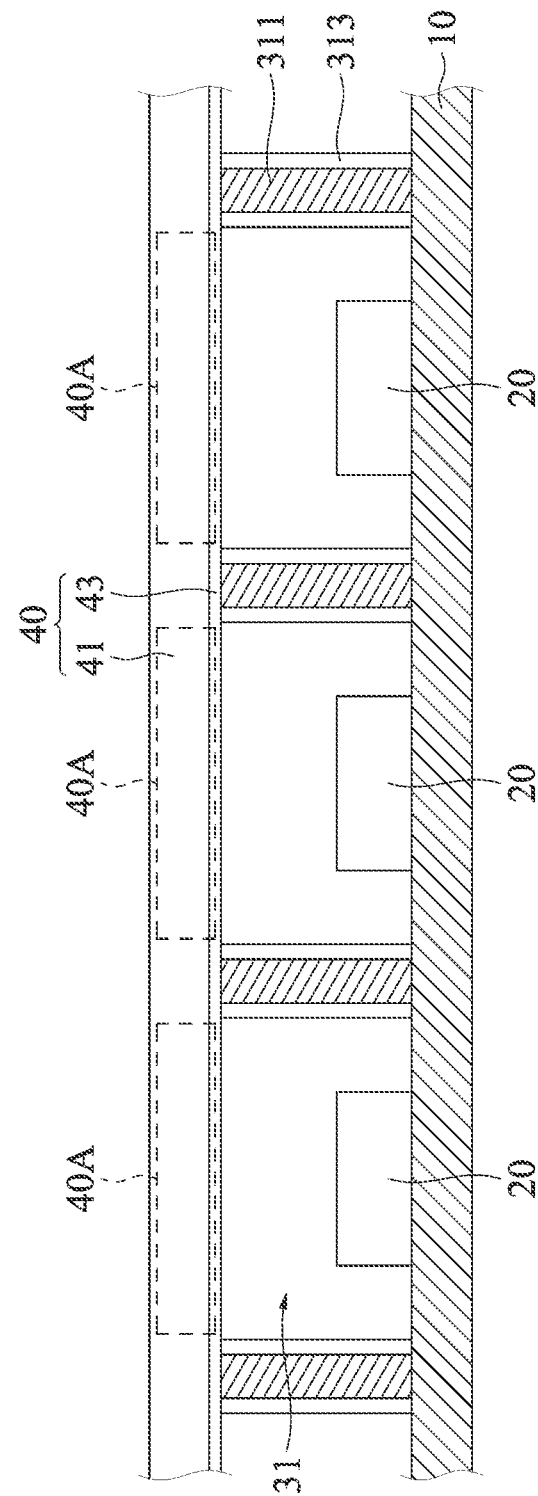
FIG. 5 to FIG. 10 are partial sectional views of light-emitting touch panels according to Embodiment IV to Embodiment IX.

FIG. 5 to FIG. 10 are partial sectional views of light-emitting touch panels according to Embodiment IV to Embodiment IX. As shown in FIG. 5, the cover plate 40 in Embodiment IV includes a light-transmitting cover plate 41 and a semi-light-transmitting layer 43. The semi-light-transmitting layer 43 is disposed on the light-transmitting cover plate 41 and faces the light-emitting element 20. In some embodiments, the semi-light-transmitting layer 43 is a semi-light-transmitting ink coated on the light-transmitting cover plate 41.

In more detail, each partition wall 311 is provided with a reflective element 313. The reflective element 313 may be a reflective coating, a reflective sheet or a reflective film. The reflective element 313 can concentrate the light emitted to the partition wall 311 by the light-emitting element 20 to the light-transmitting region 40A, thereby increasing the overall luminous efficiency.

Figure 6:
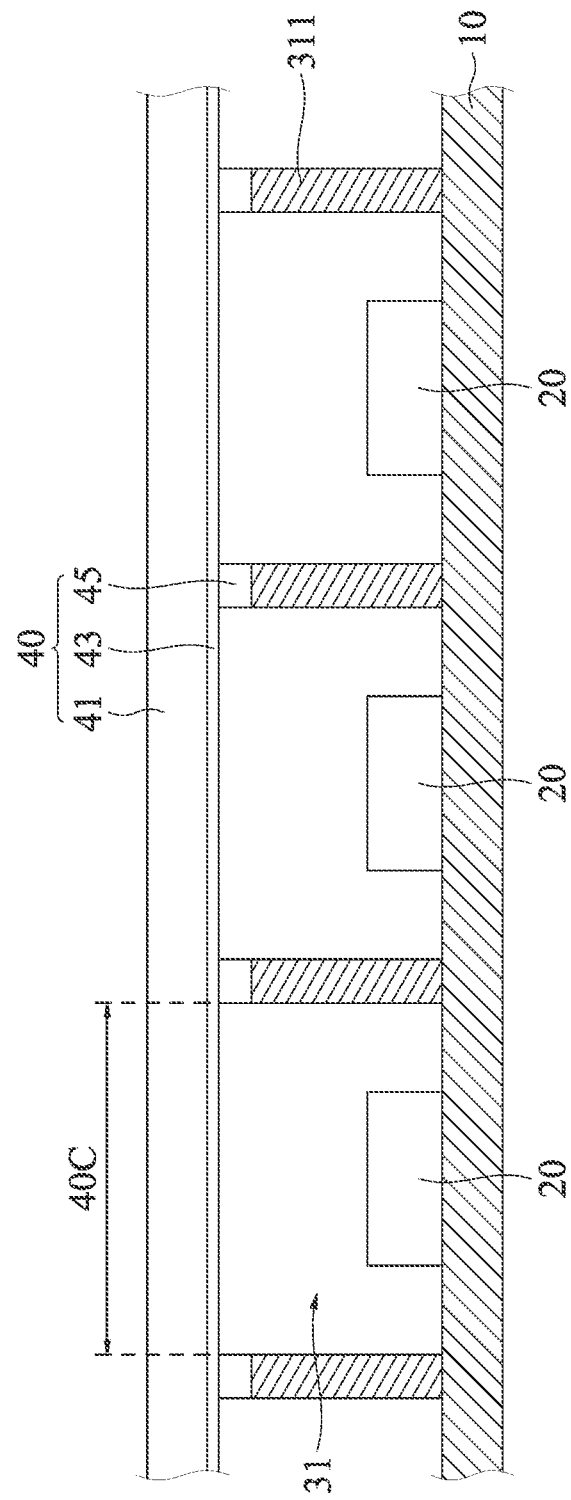

As shown in FIG. 6, referring to FIG. 5, Embodiment V is different mainly in the structure of the cover plate 40. The cover plate 40 is provided with a plurality of shading elements 45, and the semi-light-transmitting layer 43 is between the light-transmitting cover plate 41 and the shading elements 45. A plurality of light exit regions 40C are defined between the shading elements 45. The width of the light exit regions 40C are substantially the same as the light-transmitting regions 40A of the light-transmitting cover plate 41 and are corresponding to the spacing regions 31 respectively. Mixing of light generated by different light-emitting elements 20 can be avoided by the shading elements 45, and the outline of the light pattern can be more obvious.

Figure 7:
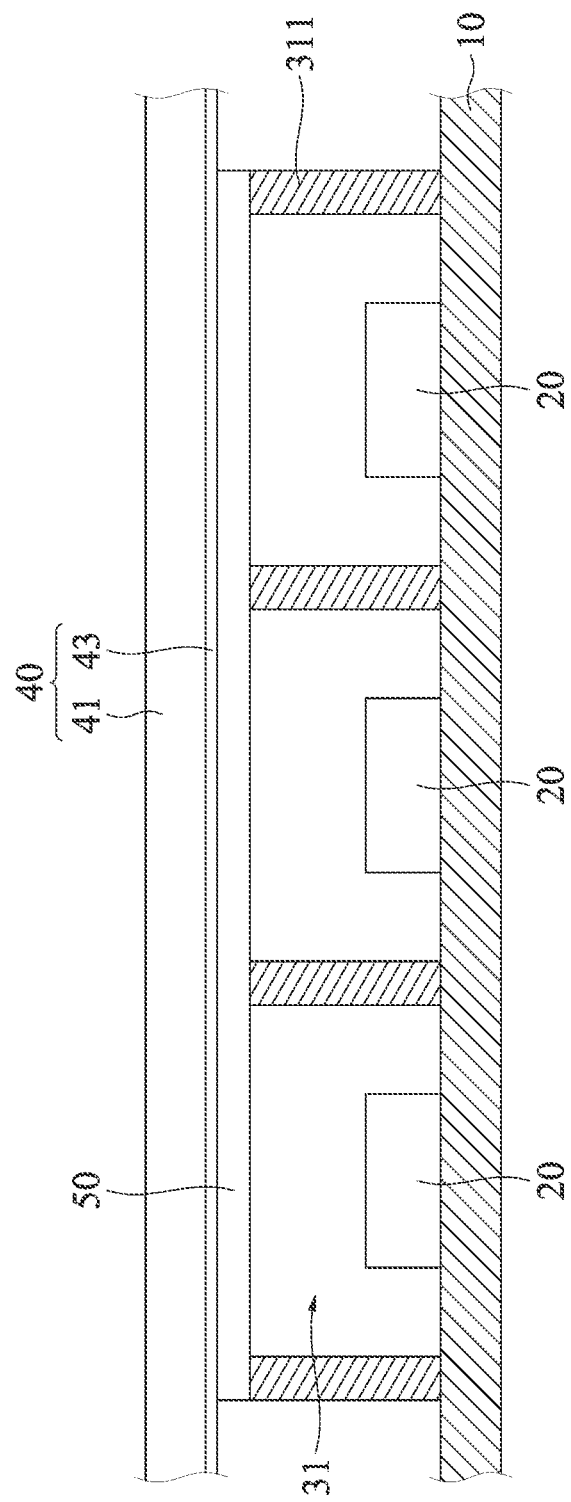
Figure 8:
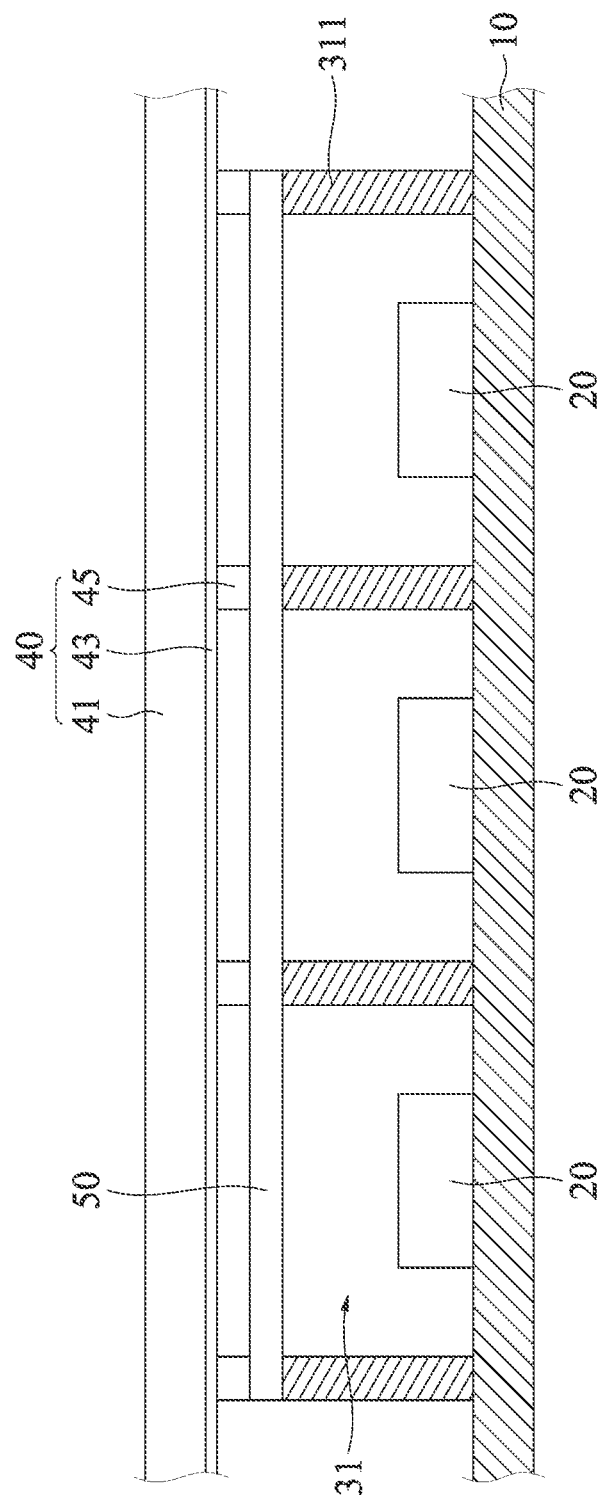

As shown in FIG. 7, referring to FIG. 5, the light-emitting touch panel 1 of Embodiment VI further includes a diffusion sheet 50. The diffusion sheet 50 is on the shading plate 30 and between the shading plate 30 and the semi-light-transmitting layer 43. Similarly, as shown in FIG. 8, referring to FIG. 6, the light-emitting touch panel 1 of Embodiment VII further includes a diffusion sheet 50. The diffusion sheet 50 is on the shading plate 30 and between the shading plate 30 and the shading elements 45. The diffusion sheet 50 makes the light more uniform and further optimizes the visual effect.

Figure 9:
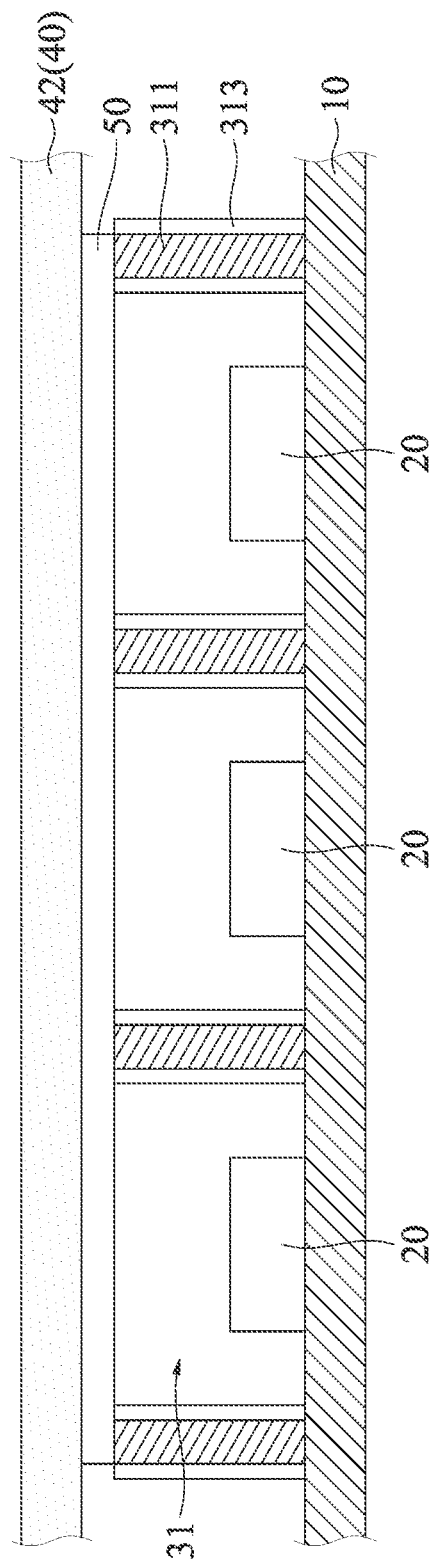
Figure 10:
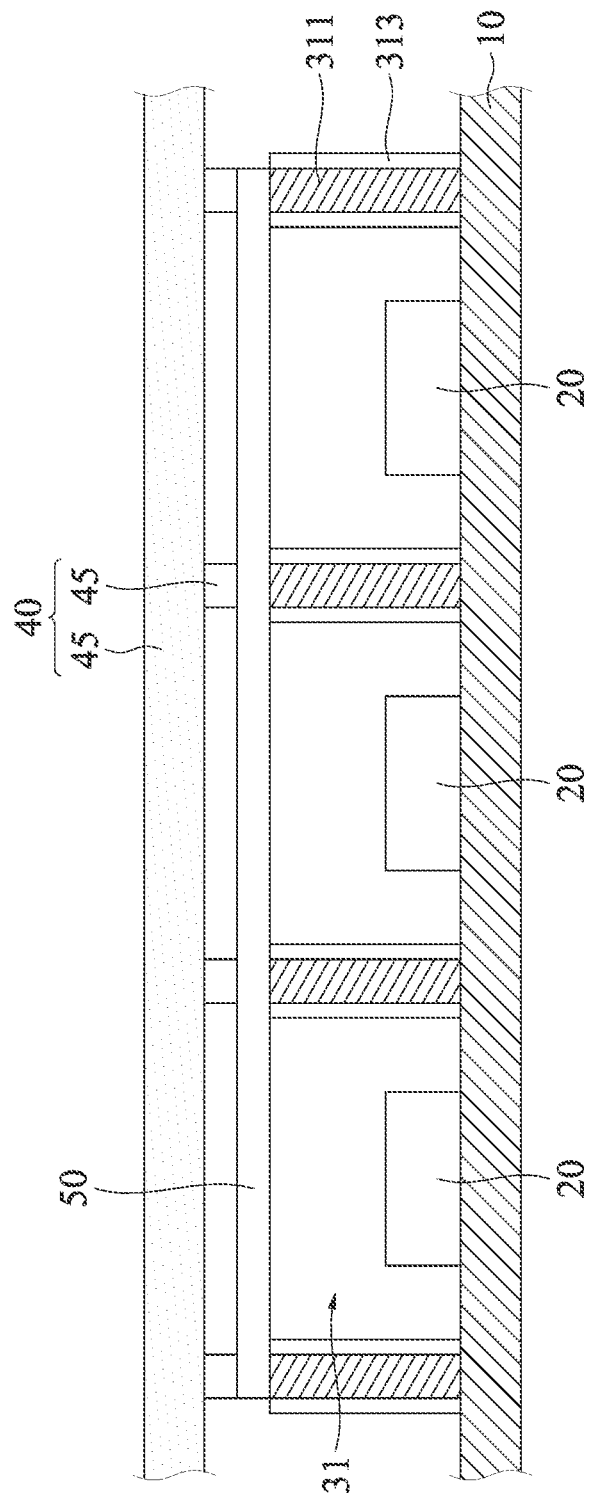

As shown in FIG. 9, the cover plate 40 of Embodiment VIII is a semi-light-transmitting polyester film sheet 42, so that better flexibility and smaller thickness can be achieved. Further, a diffusion sheet 50 may also be provided to make the light uniform. As shown in FIG. 10, referring to FIG. 9 and FIG. 6, the semi-light-transmitting polyester film sheet 42 may be further provided with a shading element 45.

Here, in the foregoing embodiments, height adjustments in Embodiment I to III may be combined with element configurations in Embodiment IV to IX to match optical path design required by various light-emitting touch panels 1, so as to achieve the required visual configuration.

Figure 11:
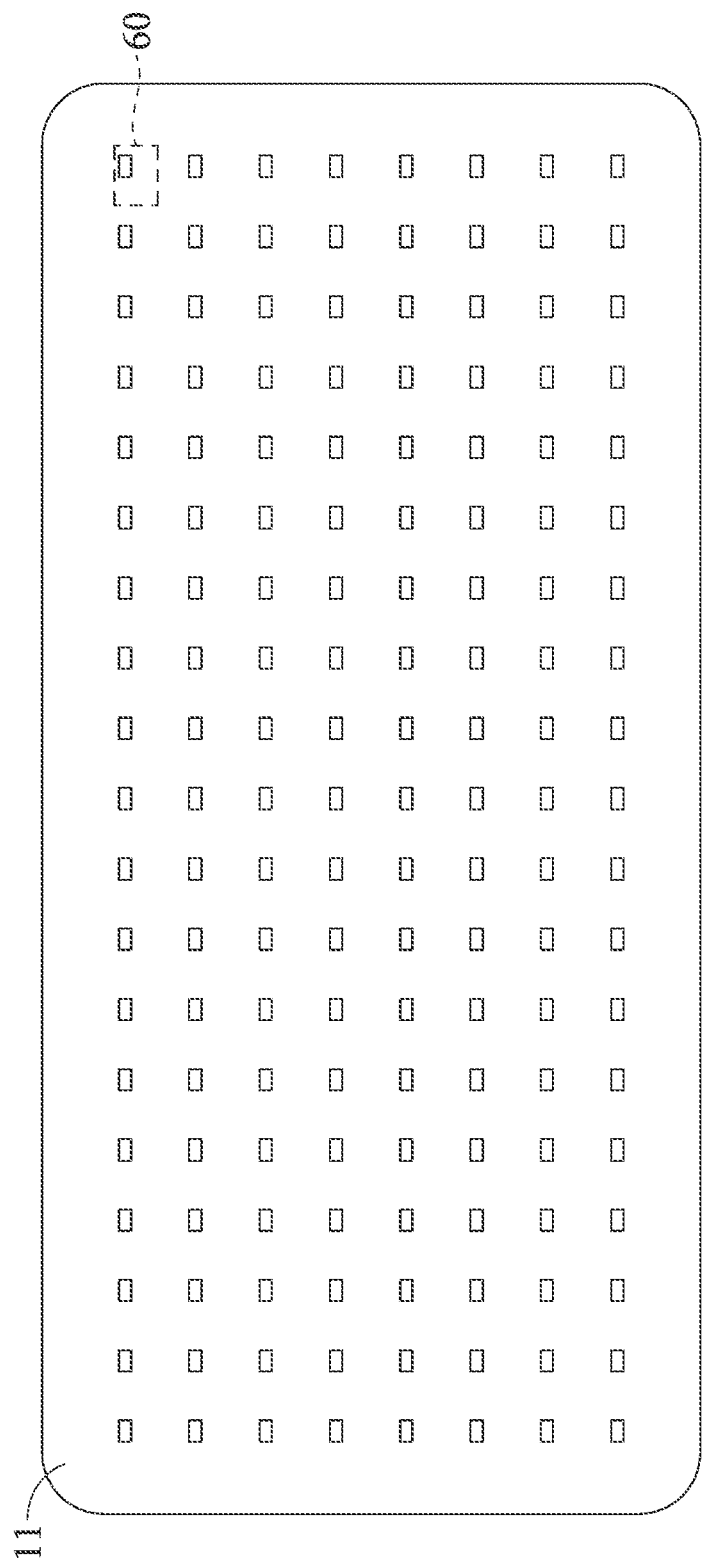
FIG. 11 is a top view of a light-emitting touch panel according to an embodiment.
Figure 12:
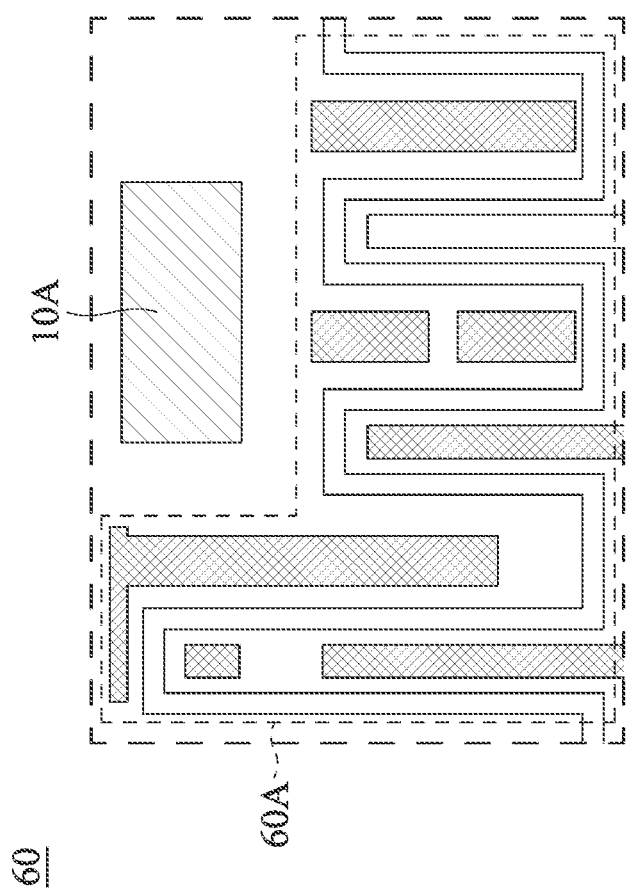
FIG. 12 is a partial enlarged view of region A in FIG. 11.

FIG. 11 is a top view of a light-emitting touch panel according to an embodiment. FIG. 12 is a partial enlarged view of region A in FIG. 11. As shown in FIG. 11 and FIG. 12, the light-emitting touch panel 1 further includes a sensing electrode layer 60. The sensing electrode layer 60 and the light-emitting element 20 are jointly disposed on a first surface 11 of the circuit board 10. The sensing electrode layers 60 define a plurality of touch-sensitive regions 60A. A plurality of light-emitting element regions 10A are defined on the circuit board 10 and configured to provide the light-emitting elements 20, and the light-emitting element regions 10A are adjacent to but spaced apart from one of the touch-sensitive regions 60A. In other words, the touch-sensitive region 60A of the sensing electrode layer 60 is adjacent to the light-emitting element region 10A so as to sense the change of capacitance adjacent to the light-emitting element 20. In this regard, the circuit layout of the sensing electrode layer 60 needs to give way to the light-emitting element region 10A for the adjacent light-emitting element 20 so as to dispose the light-emitting element 20.

Figure 13:
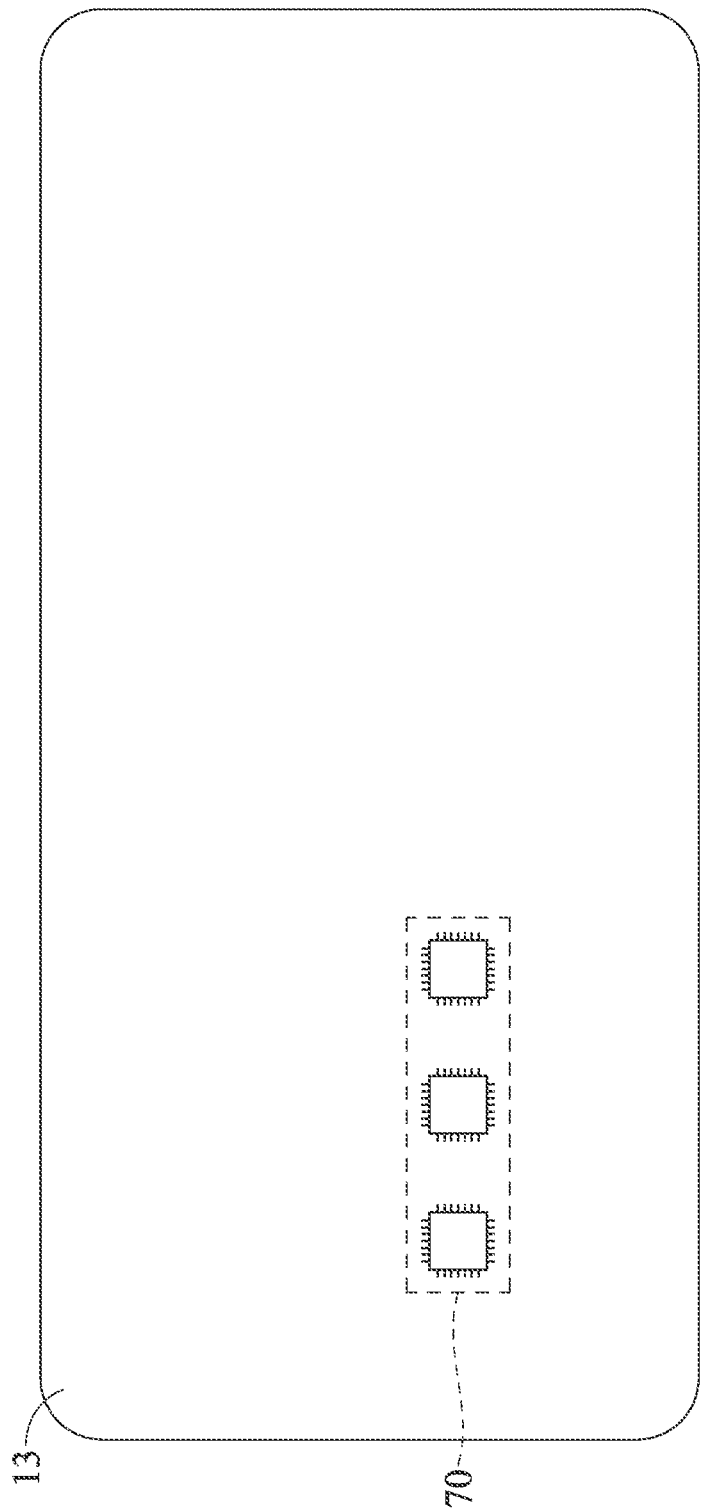
FIG. 13 is a bottom view of a light-emitting touch panel according to an embodiment.

FIG. 13 is a bottom view of a light-emitting touch panel according to an embodiment. As shown in FIG. 13, referring to FIG. 11 and FIG. 12, the light-emitting touch panel 1 further includes a control unit 70. The control unit 70 is disposed on a second surface 13 of the circuit board 10 opposite to the first surface 11. The control unit 70 is electrically connected to the sensing electrode layer 60 and the light-emitting elements 20 and configured to control a light-emitting state and a light-emitting sequence of the light-emitting elements 20 according to sensing results by the sensing electrode layer 60, thereby achieving different visual effects and touch feedbacks.

Based on the above, the light-emitting elements 20 and the shading plate 30 are directly assembled on the circuit board 10, and the light-emitting touch panel 1 emits light in a direct-light-type, so that the visual pattern is directly displayed through the light-emitting elements 20. Therefore, it is no need to use a light guide plate, which greatly reduces the thickness of the light-emitting touch panel 1. The light-emitting elements 20 can produce different light-emitting states and light-emitting sequences according to control signals so as to display different visual patterns, so that a wider range of input functions can be provided.

Although the disclosure has been described in considerable detail with reference to certain preferred embodiments thereof, the disclosure is not for limiting the scope of the invention. Persons having ordinary skill in the art may make various modifications and changes without departing from the scope and spirit of the disclosure. Therefore, the scope of the appended claims should not be limited to the description of the preferred embodiments described above.

What is claimed is:

1. A light-emitting touch panel, comprising:
a circuit board;
a plurality of light-emitting elements, arranged on the circuit board in two dimensions, each of the light-emitting elements having a first height in a first direction;
a shading plate, disposed above the circuit board, the shading plate having a plurality of spacing regions, the spacing regions corresponding to the light-emitting elements respectively, the light-emitting elements being respectively received in the spacing regions, a first width being provided between two partition walls of each of the spacing regions in a second direction, each of the partition walls having a second height in the first direction, and the second height being greater than the first height, wherein the second direction is orthogonal to the first direction; and a cover plate, disposed above the shading plate, the cover plate having a light-transmitting region, light emitted by the light-emitting elements passing through the light-transmitting region, and a bright region being formed on a top surface of the cover plate away from the shading plate, wherein a second width of the bright region in the second direction is related to the second height and the first width.

2. The light-emitting touch panel according to claim 1, wherein each of the light-emitting elements has a light-emitting angle, a projection height of the light-emitting element is defined as Equation (I), a height difference between the second height and the first height is greater than the projection height, and the second width of the bright region in the second direction is equal to the first width, wherein Equation (I) is $$Hc = \frac{W1}{2}\tan(90 - \frac{\theta}{2}),$$

wherein Hc is the projection height, W1 is the first width, and θ is the light-emitting angle.

3. The light-emitting touch panel according to claim 1, wherein each of the light-emitting elements has a light-emitting angle, a projection height of the light-emitting element is defined as Equation (I), the cover plate has a thickness in the first direction, a height difference between the second height and the first height is greater than a difference between the projection height and the thickness, the height difference between the second height and the first height is less than the projection height, and the second width of the bright region in the second direction is greater than the first width, wherein Equation (I) is $$Hc = \frac{W1}{2}\tan(90 - \frac{\theta}{2}),$$

wherein Hc is the projection height, W1 is the first width, and θ is the light-emitting angle.

4. The light-emitting touch panel according to claim 1, wherein each of the light-emitting elements has a light-emitting angle, a projection height of the light-emitting element is defined as Equation (I), the cover plate has a thickness in the first direction, a height difference between the second height and the first height is less than a difference between the projection height and the thickness, and the second width of the bright region in the second direction is less than the first width, wherein Equation (I) is $$Hc = \frac{W1}{2}\tan(90 - \frac{\theta}{2}),$$

wherein Hc is the projection height, W1 is the first width, and θ is the light-emitting angle.

5. The light-emitting touch panel according to claim 1, wherein each of the partition walls is provided with a reflective element.

6. The light-emitting touch panel according to claim 1, wherein the cover plate comprises a light-transmitting cover plate and a semi-light-transmitting layer, the semi-light-transmitting layer is disposed on the light-transmitting cover plate.

7. The light-emitting touch panel according to claim 6, wherein the cover plate is further provided with a plurality of shading elements, a plurality of light exit regions are defined between the shading elements, and the light exit regions are respectively corresponding to the spacing regions.

8. The light-emitting touch panel according to claim 7, further comprising a diffusion sheet, wherein the diffusion sheet is on the shading plate and between the shading plate and the shading elements.

9. The light-emitting touch panel according to claim 6, further comprising a diffusion sheet, wherein the diffusion sheet is on the shading plate and between the shading plate and the semi-light-transmitting layer.

10. The light-emitting touch panel according to claim 1, wherein the cover plate is a semi-light-transmitting polyester film sheet.

11. The light-emitting touch panel according to claim 10, wherein the cover plate is further provided with a plurality of shading elements, a plurality of light exit regions are defined between the shading elements, and the light exit regions are respectively corresponding to the spacing regions.

12. The light-emitting touch panel according to claim 11, further comprising a diffusion sheet, wherein the diffusion sheet is on the shading plate and between the shading plate and the shading elements.

13. The light-emitting touch panel according to claim 10, further comprising a diffusion sheet, wherein the diffusion sheet is on the shading plate and between the shading plate and the cover plate.

14. The light-emitting touch panel according to claim 1, further comprising:

a sensing electrode layer, wherein the sensing electrode layer and the light-emitting elements are jointly disposed on a first surface of the circuit board, the sensing electrode layers define a plurality of touch-sensitive regions, a plurality of light-emitting element regions are defined on the circuit board, the light-emitting element regions are configured to provide the light-emitting elements, and the light-emitting element regions are adjacent to but spaced apart from one of the touch-sensitive regions; and a control unit, disposed on a second surface of the circuit board opposite to the first surface, wherein the control unit is electrically connected to the sensing electrode layer and the light-emitting elements and configured to control a light-emitting state and a light-emitting sequence of the light-emitting elements according to sensing results by the sensing electrode layer.

* * * * *